United States Patent
Kakutani

(10) Patent No.: US 7,293,686 B2
(45) Date of Patent: *Nov. 13, 2007

(54) BONDING APPARATUS

(75) Inventor: Osamu Kakutani, Oume (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 323 days.

This patent is subject to a terminal disclaimer.

(21) Appl. No.: 10/973,364

(22) Filed: Oct. 25, 2004

(65) Prior Publication Data

US 2005/0109815 A1    May 26, 2005

(30) Foreign Application Priority Data

Oct. 23, 2003   (JP) .............................. 2003-362711

(51) Int. Cl.
*B23K 37/00* (2006.01)
(52) U.S. Cl. .......................................... 228/9; 228/4.5
(58) Field of Classification Search .................... 228/9, 228/4.5, 110.1, 180.5
See application file for complete search history.

(56) References Cited

U.S. PATENT DOCUMENTS 5,839,640 A * 11/1998 Kinnaird ..................... 228/4.5
7,096,912 B2 * 8/2006 Kakutani .................... 156/358
2004/0245314 A1 * 12/2004 Vischer ...................... 228/4.5

FOREIGN PATENT DOCUMENTS

JP      2002-329772      11/2002

* cited by examiner

*Primary Examiner*—Jonathan Johnson
(74) *Attorney, Agent, or Firm*—Koda & Androlia

(57) ABSTRACT

A wire bonder including two link driving mechanisms and a head supporting stage provided with a bonding head via fluid pressure so that the bonding head is movable in the horizontal plane. Each link driving mechanism is formed by a motor, a driving arm, and a movable arm. The movable arm that extends from the driving arm of the first link driving mechanism is fastened to the bonding head, and the movable arm that extends from the driving arm of the second link driving mechanism is rotatably connected at its one end to the bonding head. A thrust aiming at the center of gravity of the bonding head is applied to the bonding head by the movable arms, thus moving the bonding head around.

4 Claims, 6 Drawing Sheets

BONDING APPARATUS

BACKGROUND OF THE INVENTION

1. Technical Field

The present invention relates to a bonding apparatus and more particularly to a bonding apparatus that includes a moving mechanism which moves a bonding section that performs bonding work into arbitrary positions.

2. Description of the Related Art

A wire bonder connects a plurality of bonding pads disposed on a die of semiconductor chip or the like, with bonding leads disposed on a circuit board or the like by means of a fine gold wire or the like. In order to achieve correct positioning and bonding of such a gold wire or the like in specified positions on such bonding pads and bonding leads, a wire bonder needs to have a mechanism that moves a bonding head, which is mounted with a bonding tool (that allows a gold wire to pass through and holds the gold wire) and a positioning camera, to arbitrary positions is required.

FIG. 9 is a top view of the moving mechanism of the bonding head 20 in a conventional wire bonder 10 disclosed in Japanese Patent Application Laid-Open (Kokai) No. 2002-329772.

The mechanism used in this prior art is known as a so-called XY table mechanism; and in this mechanism, an X table 16 and Y table 18 are provided on top of a table holder 14 disposed on the upper surface of the stand 12 of the wire bonder 10, and the bonding head 20 is provided on the Y table 18. A bonding tool 22 (which has at the tip end a capillary through which a gold wire is passed and in which the gold wire is held) and a position detection camera 24 are mounted on the bonding head 20. A circuit board conveying path 50 is disposed on the stand 12, and circuit boards are conveyed to a bonding work region 52 that is located substantially directly beneath the bonding tool 22.

Accordingly, by way of moving the bonding head 20 to an arbitrary position in the XY plane by moving the X table 16 in the X direction and by moving the Y table 18 in the Y direction over the surface of the X table 16, the position to be bonded on a circuit board is detected using the position detection camera 24, and the bonding tool 22 is moved into the desired position based upon this detection. The bonding tool is then moved in the Z direction by means of a Z direction moving mechanism (not shown in FIG. 9) so that bonding is performed.

The X table 16 is driven by an X direction linear motor 30 and is guided by a linear guide (not shown in FIG. 9) so that the X table 16 is moved in the X direction over the surface of the table holder 14. More specifically, the X direction linear motor 30 comprises a driving portion 32, which generates a driving magnetic field in a direction perpendicular to the coil, and a movable coil 34, which receives a thrust in the X direction from the driving magnetic field when a coil current is caused to flow. The movable coil 34 is connected to the X table 16 via an arm 36. The Y table 18 is driven by a Y direction linear motor 40 and is guided by a linear guide (not shown in FIG. 9) so that the Y table 18 is moved in the Y direction over the surface of the X table 16. The Y direction linear motor 40 also comprises a driving portion 42, which generates a driving magnetic filed in a direction perpendicular to the XY plane, and a movable coil 44, which receives a thrust in the Y direction from the driving magnetic field as a result of the X direction component current that is generated when a coil current is caused to flow. The movable coil 44 is connected to the Y table 18 via an arm 46.

As seen from the above, the bonding head is moved to an arbitrary position by using such an XY table mechanism. However, since this mechanism is driven by applying a thrust generate by the cooperative action of the movable coils of linear motors and driving magnetic fields directly to the bonding head, there are limits to the increase in speed that is possible (as will be described below).

Where F is the thrust of the motor, m is the mass of the movable part such as the movable coil, etc., in the motor, and M is the mass of the bonding head and table, etc., that are driven, then the acceleration $\alpha$ is indicated by $\alpha=F/(M+m)$. The acceleration increases to some extent by reducing M as far as possible; however, the limit in this case is determined by F/m. If the size of the movable part of the motor increases, e.g., if the number of turns of the movable coil is increased, the thrust F increases. At the same time, however, the mass of the movable part also increases. Accordingly, if an attempt is made to use a motor with a higher power, F/m, which is the limit of the acceleration a, is still hit as an upper limit, and there are limits to the increase in speed.

BRIEF SUMMARY OF THE INVENTION

It is, therefore, an object of the present invention to solve the above-described problems encountered in the prior art.

It is another object of the present invention to provide a bonding apparatus that allows a further increase in the moving speed of the bonding head.

It is still another object of the present invention to provide a bonding apparatus that can further improve the positioning precision of the bonding head.

The above objects of the present invention are accomplished by a unique structure of the present invention for a bonding apparatus that includes a bonding head, which performs bonding work on an object of bonding, and a moving mechanism, which moves the bonding head to arbitrary positions; and in the present invention, the moving mechanism comprises:
 a first motor, a first driving arm which is attached to a drive shaft of the first motor and is rotated in a plane that is parallel to a stand of the bonding apparatus, a first movable arm which is provided at one end thereof on the first driving arm so as to be rotatable,
 a second motor, a second driving arm which is attached to a drive shaft of the second motor and is rotated in a plane that is parallel to the stand, and a second movable arm which is provided at one end thereof on the second driving arm so as to be rotatable; and
 the first movable arm is fastened at another end thereof to the bonding head, and the second movable arm is connected at another end thereof to the bonding head via a connecting shaft.

In the above structure of the present invention, the intersection point between a first line segment, which connects the center of rotation of the first movable arm and the fastening point where the first movable arm is fastened to the bonding head, and a second line segment, which connects the center of rotation of the second movable arm and the point where the second movable arm is provided by the shaft (or thus shaft-supported), are set so as to be substantially coincide with the position of the center of gravity of the bonding head.

It is preferable that the bonding head be supported on the stand by fluid pressure.

It is also preferable that the stand be a suspension stand in which the bonding head is suspended by the bonding head.

Furthermore, in the above bonding apparatus of the present invention, it is preferable that the bonding apparatus further include: a first sensor that detects the rotational angle of the first driving arm, a second sensor that detects the rotational angle of the second driving arm, a position calculating means for calculating the position of the bonding head as a position in an orthogonal coordinate system with respect to the stand based upon the detection data of the first sensor and upon the detection data of the second sensor, and a control means for performing a positional control of the bonding head based upon the calculated position in the orthogonal coordinate system.

DETAILED DESCRIPTION OF THE INVENTION

Embodiments of the present invention will be described below in detail with reference to the accompanying drawings. A wire bonder will be described as an example of the bonding apparatus; and it should be noted that the present invention is applicable to such a bonding apparatus as a die bonder, a face-down bonder, etc.

Figure 1:
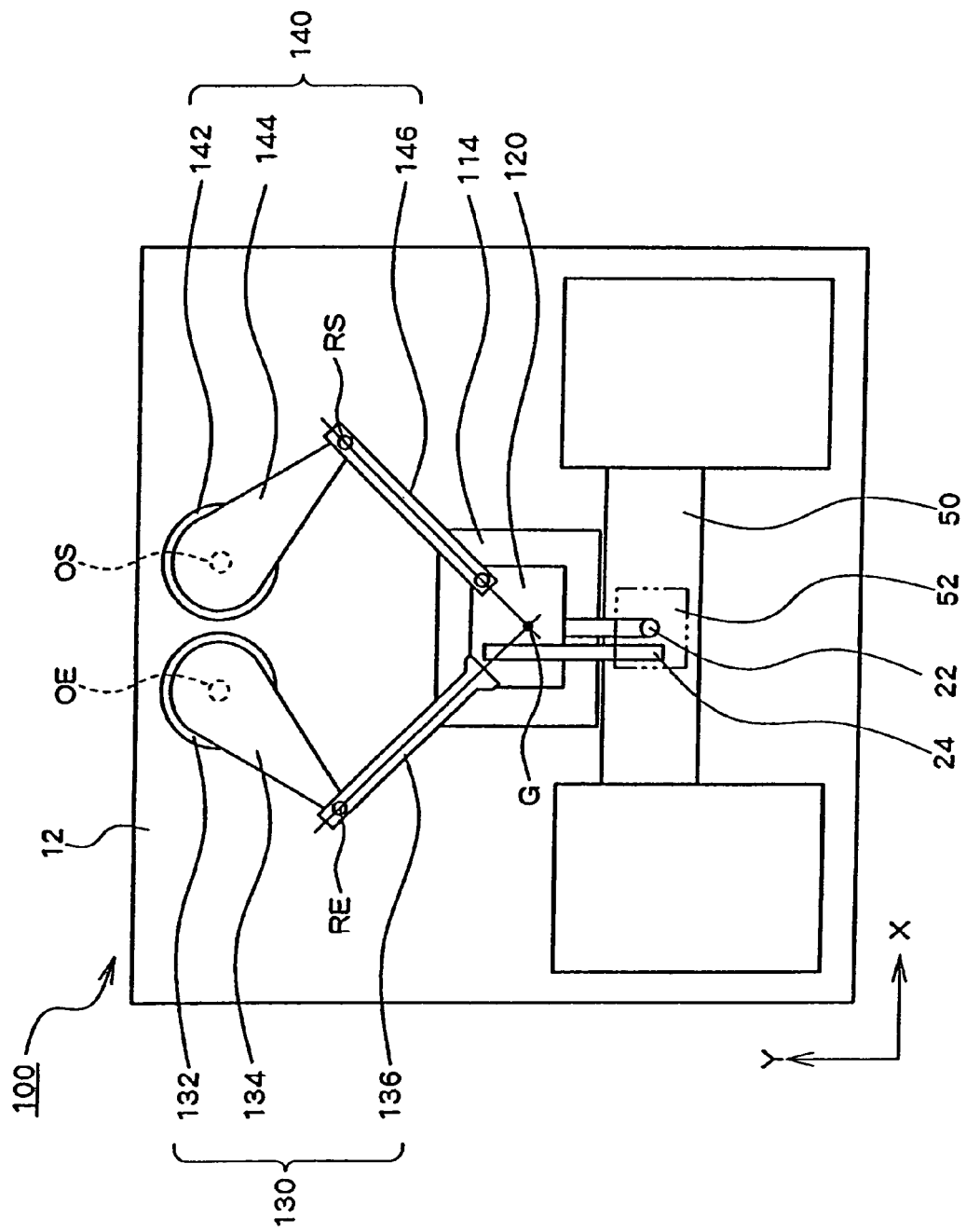
FIG. 1 is a top view of the wire bonder according to one embodiment of the present invention, particularly showing the moving mechanism of the bonding head.
Figure 2:
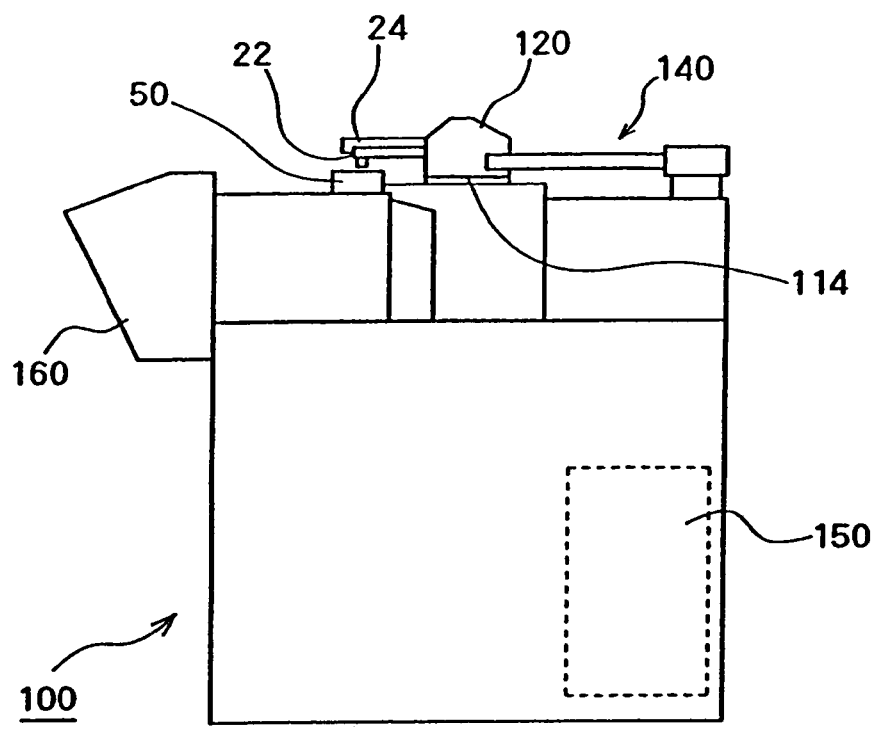
FIG. 2 is a side view of the wire bonder of FIG. 1.
Figure 9:
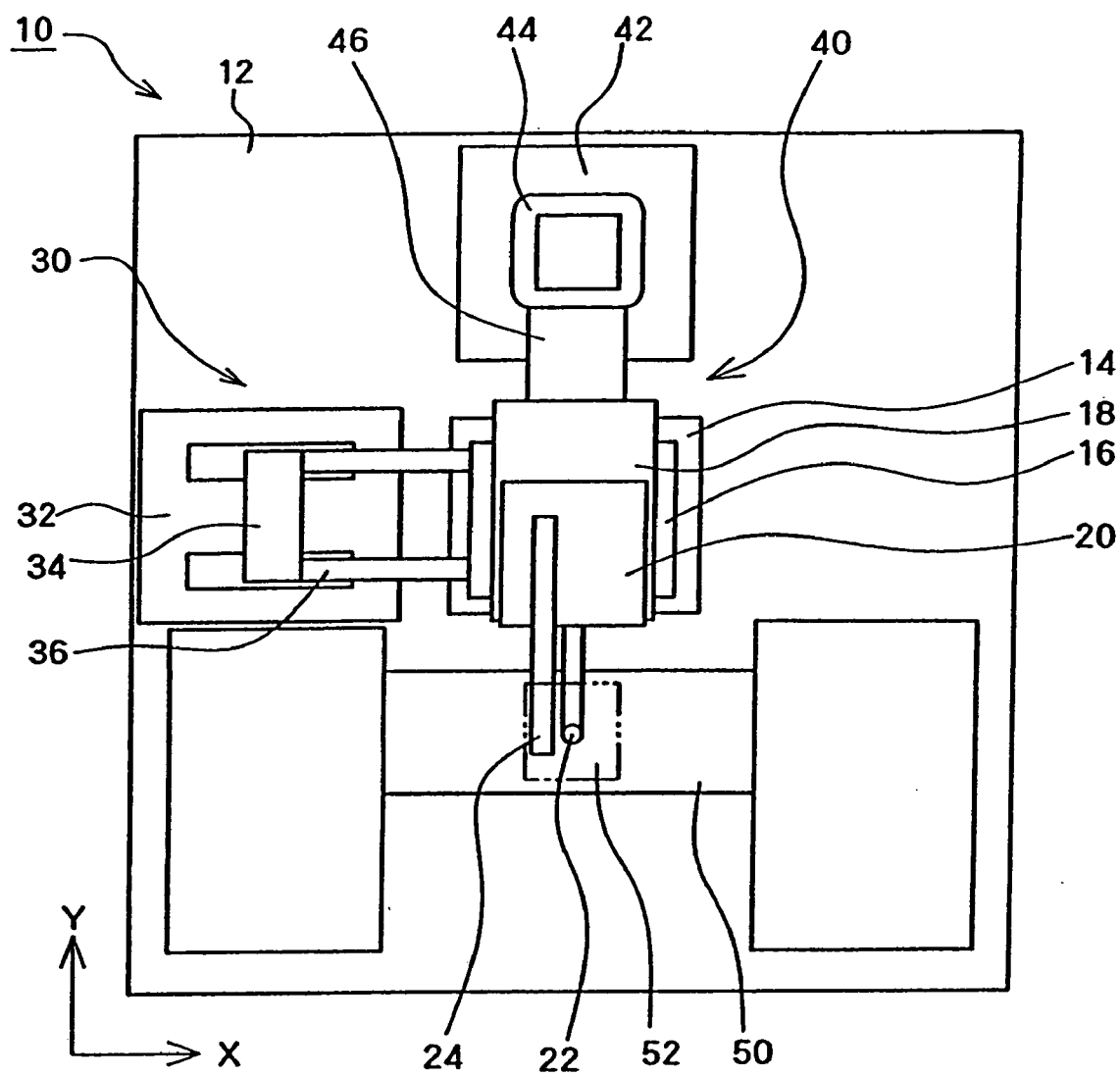
FIG. 9 is a top view of the moving mechanism of the bonding head in a conventional wire bonder.

FIG. 1 is a top view of the wire bonder 100 and shows in particular the moving mechanism of the bonding head 120. FIG. 2 is a side view of the wire bonder 100. Elements that are the same as in FIG. 9 are labeled with the same reference numerals.

The wire bonder 100 includes, on its stand 12, two link driving mechanisms 130 and 140, a head supporting stage 114 that is provided with the bonding head 120 by fluid pressure so that the bonding head 120 is movable within the horizontal plane, and a circuit board conveying path 50.

The bonding head 120 is comprised of a bonding tool 22, which has a capillary (through which a gold wire is passed and in which this gold wire is held) at the end, and a position detection camera 24. The bonding head 120 has a flat bottom surface. As will be described in detail below, the respective movable arms 136 and 146 of the two link driving mechanisms 130 and 140 are connected to the bonding head 120. A bonding work region 52 is established substantially directly beneath the boning tool 22, and circuit boards are conveyed into this boding work region by the conveying path 50. The bonding tool 22 can be moved in the Z direction that is perpendicular to the XY plane shown in FIG. 1 by a Z direction moving mechanism not shown in the drawings.

As shown in FIG. 2, a control section 150 and an operating panel 160 are provided in the wire bonder 100. The operating panel 160 sets the conditions required for wire bonding work; and the necessary conditions are inputted thereby manually or by button setting, etc. The control section 150 is an electronic circuit block that controls the overall operation of the wire bonder 100; and by executing operating program in accordance with the set conditions, for instance, the link driving mechanisms 130 and 140 and fluid pressure supporting operation are controlled, and the positioning control of the bonding head 120 is accomplished. Some or all of the functions of the control section 150 may also be performed by hardware.

The two link driving mechanisms 130 and 140 make positioning of the bonding head 120 by means of five (5) rotational centers and links that connect these centers together with the bonding head 120. These mechanisms thus respectively constitute a so-called five joint closed link structure.

The first link driving mechanism 130 is constructed from a first motor 132, a first driving arm 134 and a first movable arm 136.

The first motor 132 has a drive shaft OE in the direction perpendicular to the surface of the stand 12, i.e., perpendicular to a plane parallel to the XY plane shown in FIG. 1. The first motor 132 can be, for instance, a direct drive type motor (called a "DD motor"). In concrete terms, an NMR-FDFB DD motor manufactured by Nikki Denso Co., Ltd. can be employed. This motor has a rated torque of 22.5 Nm, and an inertia of $72 \times 10^{-4}$ Kgm$^2$. The first motor 132 is disposed on the stand 12 as shown in FIG. 1; and it can be, however, installed inside the stand 12 with the drive shaft OE protruding above the stand 12.

The first driving arm 134 is attached to the drive shaft OE and is rotated in a plane parallel to the XY plane by the drive shaft OE. The first driving arm 134 has a first movable arm 136 at its tip end so that the first movable arm 136 is connected at one end thereof to the first driving arm 134 in a rotatable fashion at the rotational center RE. The first driving arm 134 can be molded from a material that has a light weight and a high rigidity, e.g., a carbon fiber reinforced resin (CRFP), etc. The first driving arm 134 is asymmetrical with respect to the drive shaft OE in the lengthwise direction; accordingly, a balance weight can be preferably disposed on the side (with respect to the drive shaft OE) which is opposite from the side the first driving arm 134 extends.

The distance between the drive shaft OE of the first motor 132 and the rotational center RE on the tip end of the first driving arm 134 is set at, for instance, 120 mm. In this case, if the above-described NMR-FDFB DD motor is used, the thrust of the tip end of the arm is 187.5 N. Since the arm tip end converted mass of the motor rotating part is set at 0.5 kg, and the total load mass of the bonding head 120, etc., is set at 1.5 kg, so that the overall mass is 1.5 kg, the rated acceleration is thus 12.3 G, and the instantaneous maximum acceleration of, for instance, three times this value, i.e., 36.9 G is obtained.

The first movable arm 136 is movable within the XY plane about the rotational center RE. The first movable arm 136 is fastened at another end thereof to a fixing end 138 of the bonding head 120. The material of the first movable arm can be the same as that used for the first driving arm 134. The rigidity/specific mass ratio of CRFP is approximately ten times that of iron or aluminum. For example, an arm CRFP molding with a total length of 200 mm and a cross-sectional area of 180 mm² has a mass of 61 grams, and the characteristic vibration frequency when a mass of 1 kg is applied to both ends is approximately 5 kHz; and thus there are no problems in terms of high-speed wire bonder performance.

The second link driving mechanism 140 is constructed from a second motor 142, a second driving arm 144, and a second movable arm 146. The second motor 142 can be the same type of motor as the first motor 132; and the second driving arm 144 can be the same as the first driving arm 134, except for the fact that the second driving arm 144 is attached to the drive shaft OS of the second motor 142. Accordingly, performance values such as the thrust of the arm tip end, rated acceleration and instantaneous maximum acceleration, etc., can be substantially the same as the first link driving mechanism 130.

The second movable arm 146 of the second link driving mechanism 140 is connected at its one end to the tip end of the second driving arm 144 in a rotatable fashion about the rotational center RS within the XY plane. The material of this second movable arm 146 is the same as that of the first movable arm 136; and the second driving arm 144 can be made as the same material as that of the second movable arm 146. Nonetheless, the material of these driving arms and movable arms can be different. The second movable arm 146 is connected via a shaft (not shown) at another end thereof to a shaft-supporting end 148 of the bonding head 120 so as to be rotatable.

The fastening of the end of the first movable arm 136 and the bonding head 120 at the fixing end 138 can be made by, for instance, bolt fastening or screw fastening. Alternatively, a joining technique such as bonding, etc., can be used. Furthermore, the bonding head 120 and first movable arm 136 can be connected to as to form a single unit.

The connection of the end of the second movable arm 146 and the bonding head 120 at the shaft-supporting end 148 can be made by a structure that uses a rotary bearing. Alternatively, a so-called cross pivot plate spring can be employed. A cross pivot plate spring is an element that has four mutually perpendicular plate spring attachment portions about its central supporting point. Among the four plate spring attachment portions, two parts that extend in the direction of the same axis (for example, the X axis) are attached to one end of the second movable arm 146, while the other two parts extending in the direction (Y direction) that is perpendicular to this axis are attached to the bonding head 120, so that the central supporting point of the cross pivot plate spring can be used as a shaft supporting end.

The two link driving mechanisms 130 and 140 structured as described above are installed so that the intersection point between the central axis of the first movable arm 136 and the central axis of the second movable arm 146 passes through the center of gravity G of the bonding head 120. Accordingly, when a thrust aiming at the center of gravity G is applied to the bonding head 120 via the first movable arm 136 and second movable arm 146, the positional movement of the bonding head 120 is made while being regulated by the linked movements of the first movable arm 136 and second movable arm 146.

Figure 3:
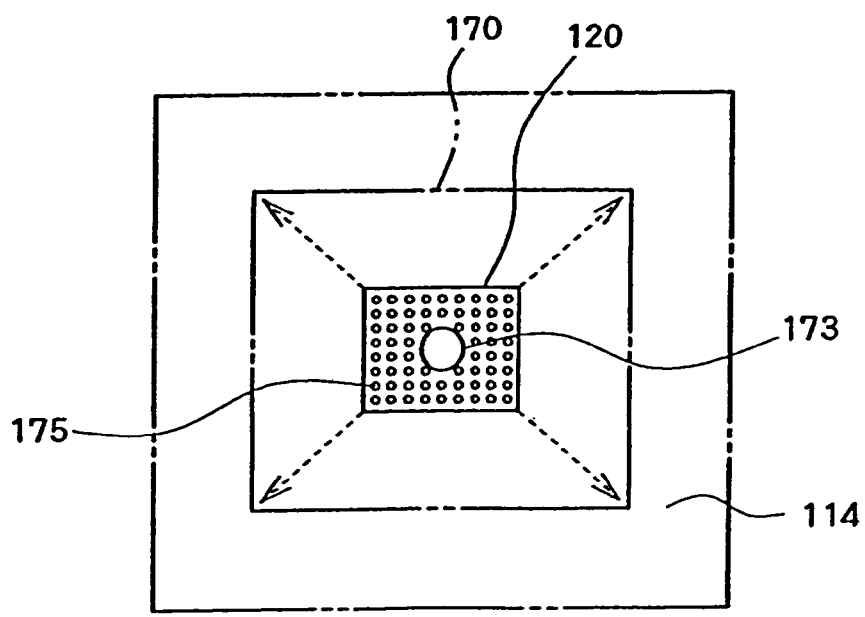
FIG. 3 shows how the bonding head is supported by fluid pressure in the embodiment of the present invention.

FIG. 3 shows the conditions of fluid pressure support between the bottom surface of the bonding head 120 and the head supporting stage 114.

In the head supporting stage 114, the central part of the stage 114 is a head supporting region 170 that has been subjected to a flattening treatment, thus being flat. The bottom surface of the bonding head 120 is also subjected to flattening treatment, and a vacuum suction port 173 and a plurality of air blowing ports 175 that are around this vacuum suction port 173 are provided substantially in the center of the head supporting region 170, so that a so-called air bearing structure is created between the bonding head 120 and the head supporting stage 114. The air blowing ports 175 comprise a plurality of holes with a diameter of, for instance, 0.5 mm. Alternatively, a material such as a sintered metal or foamed metal that has countless fine holes can be used for the air blowing ports 175, so that air is blown out of these fine holes.

The vacuum suction port 173 is connected to a vacuum device (not shown in the drawings), and the air blowing ports 175 are connected to an air pressurizing device (not shown in the drawings). Besides pressurizing and supplying air, the air pressurizing device can pressurize and supply other type of gas such as nitrogen, etc.

The vacuum pressure and air pressure are set at such appropriate values as they make it possible to cause the bonding head to float from the surface of the supporting region 170 and to cause the bonding head to move smoothly as a result of the linked movement of the first movable arm 136 and second movable arm 146.

Since the vacuum suction port 173 and the air blowing ports 175 are thus provided in the bonding head 120, the bonding head 120 is supported by fluid pressure and caused to move smoothly throughout the entire area of the head supporting region 170 as indicated by the broken line arrows in FIG. 3.

Figure 4:
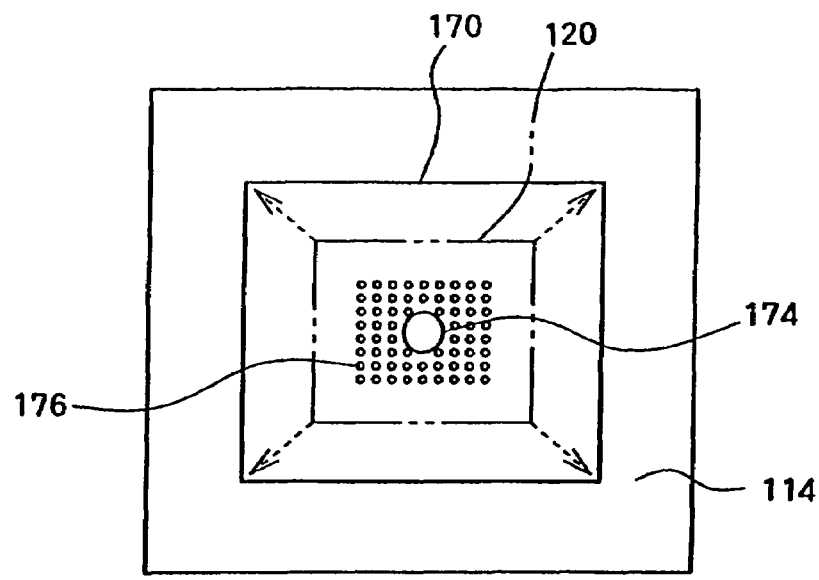
FIG. 4 shows another example of the fluid pressure support of the bonding head.

FIG. 4 shows an example in which a vacuum suction port and an air blowing ports are provided in the head supporting stage 114.

The advantage of this structure is that vacuum piping and air piping are provided in the stand of the wire bonder. On the other hand, its disadvantage is that the movement range is limited in order to prevent the bottom surface of the bonding head 120 from leaving the area of the vacuum suction port 174 and air blowing ports 176. In other words, as shown in FIG. 4, the area in which the vacuum suction port 174 and air blowing ports 176 are provided is set to be a narrow region compared to the size of the bottom surface of the bonding head 120, and the movement range of the bonding head 120 is restricted within the inner most rectangular shown by the broken lines in FIG. 4.

Figure 5:
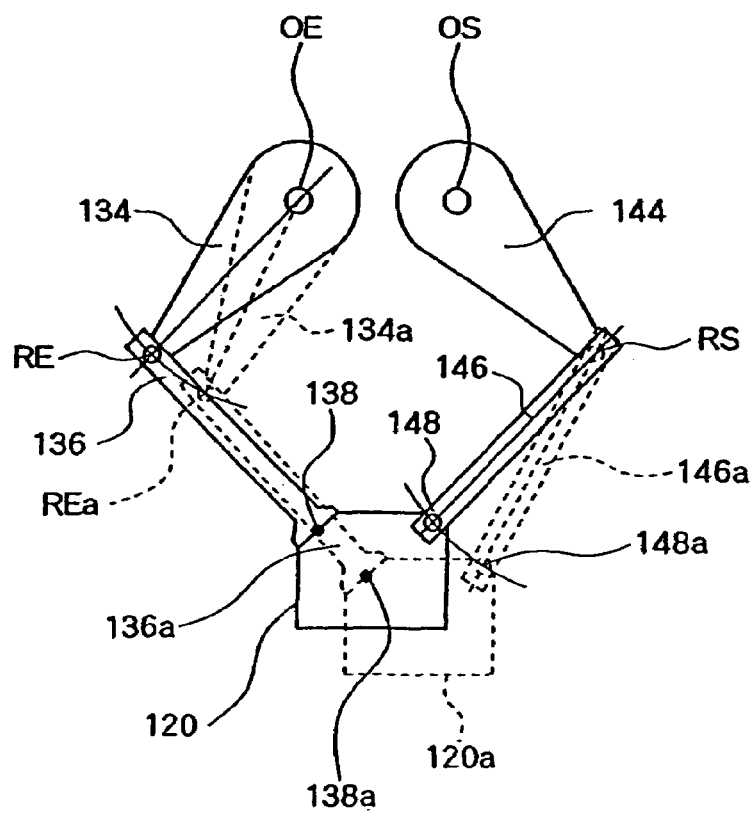
FIG. 5 is a diagram that shows an example of the movement trajectory of the bonding head in the embodiment of the present invention.
Figure 6:
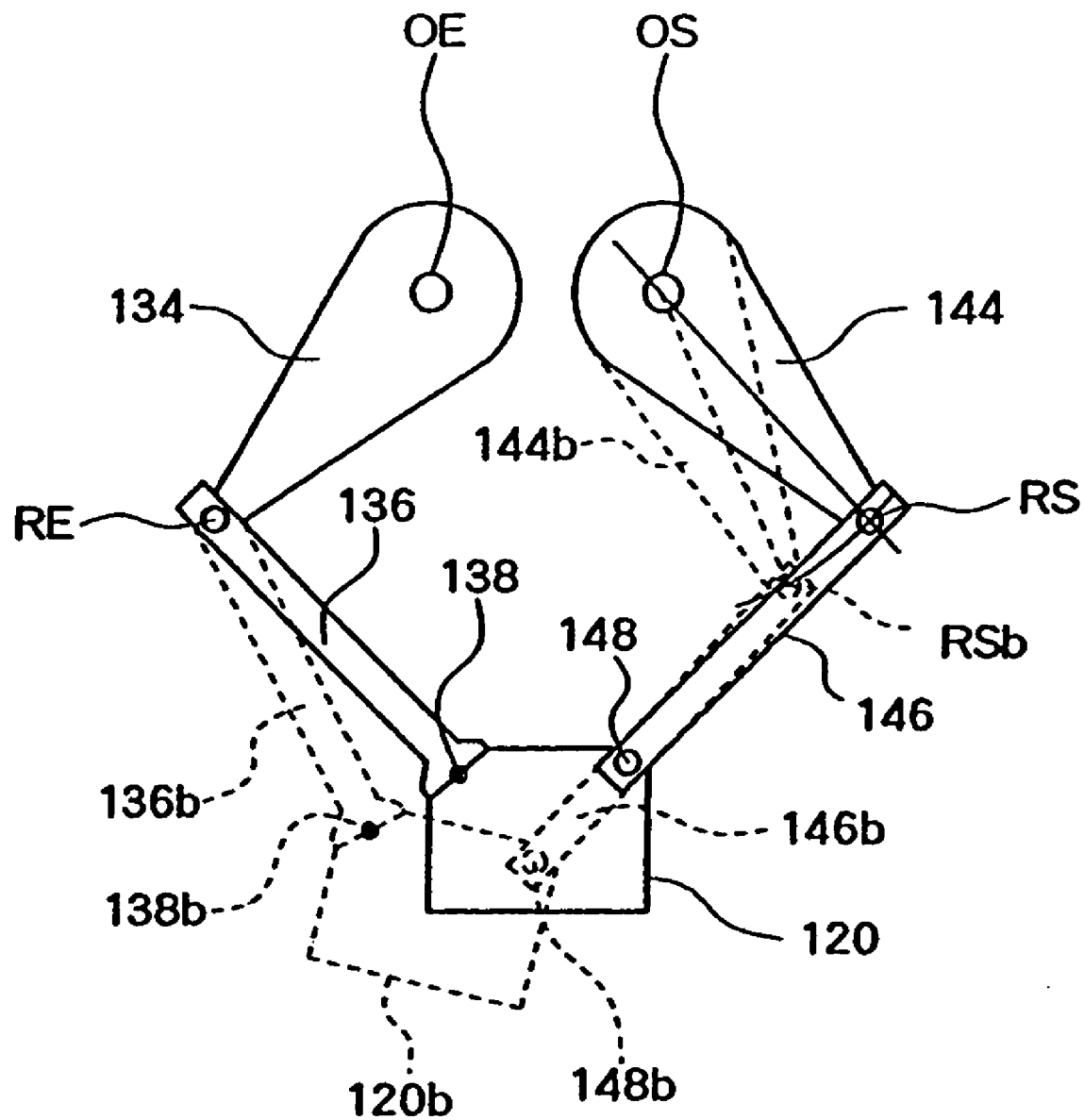
FIG. 6 is a diagram that shows another example of the movement trajectory of the bonding head in the embodiment of the present invention.

FIGS. 5 and 6 show the manner of movement of the bonding head 120 caused by the first link driving mechanism 130 and second link driving mechanism 140. In FIGS. 5 and 6, elements that are the same as those in FIG. 1 are given with the same reference numerals, and a detailed description of such elements is omitted.

In FIGS. 5 and 6, only the part of the so called five joint closed link, i.e., FIGS. 5 and 6 show only the part of the drive shaft OE of the first motor—(first driving arm 134)—rotational center RE—(first movable arm 136)—(fixing end 138)—(bonding head 120)—shaft-supporting end 148—(second movable arm 146)—rotational center RS—(second driving arm 144)—drive shaft OS of the second motor. Furthermore, in FIGS. 5 and 6, the solid lines indicate the initial state prior to the actuation of the first motor and second motor, the broken lines in FIG. 5 indicate the state after the actuation of only the first motor 132, and the broken lines in FIG. 6 indicate the state after the actuation of only the second motor 142. The respective elements after being driven are distinguished from pre-movements by adding a or b to the reference numeral of such elements.

In FIG. 5, when the second motor 142 is not driven, and only the first motor 132 is driven, only the second movable arm 146 is rotated about the rotational center RS. Assuming that the first driving arm 134 receives a rotational driving force from the first motor and rotated to the position 134a shown by the broken lines in FIG. 5, then the position of the rotational center RE shifts about the drive shaft OE along the curved solid line to the position REa, and the bonding head 120 is pushed via the first movable arm 136 to the position 120a shown by the broken lines. Meanwhile, since the relative positional relationship between the fixing end 138 of the bonding head 120 and the shaft-supporting end 148 of the bonding head 120 is invariable, the fixing end 138 of the bonding head 120 is moved along a circular arc centered on the new rotational center REa while maintaining the above-described positional relationship, and the shaft-supporting end 148 is moved along a circular arc centered on the rotational center RS to the position indicated by 148a as shown by the broken lines. Though the first movable arm 136 is also moved (rotated) slightly about the new rotational center REa, if the first movable arm 136 is sufficiently long in length compared to the length of the bonding head 120, the amount of movement (rotation) of the first movable arm 136 is slight, and points on the bonding head 120 (e.g., the center of gravity) are moved substantially in the direction of the axis of the first movable arm 136.

In FIG. 6, when the first motor 132 is not driven, and only the second motor 142 is driven, only the first movable arm 136 is rotated about the rotational center RE is permitted. Assuming that the second driving arm 144 receives a rotational driving force from the second motor 142 and rotated as indicated by the broken lines to a position of 144b in FIG. 6, then the position of the rotational center RS shits about the drive shaft OS along the curved solid line to the position RSb, and the bonding head 120 is pushed via the second movable arm 146 to the position 120b shown by the broken lines. Meanwhile, since the relative positional relationship between the fixing end 138 of the bonding head 120 and the shaft-supporting end 148 of the bonding head 120 is invariable, the fixing end 138 of the bonding head 120 is moved over a circular arc centered on rotational center RE, and the shaft-supporting end 148 is moved along a circular arc centered on the new rotational center RSb to the position indicated by 148b as shown by the broken lines. Though the second movable arm 146 is also moved (rotated) slightly about the new rotational center RSb, if the second movable arm 146 is sufficiently long in length compared to the length of the bonding head 120, the amount of movement (rotation) of the second movable arm 146 is slight, and points on the bonding head 120 (e.g., the center of gravity) are moved substantially in the direction of the axis of the second movable arm 146.

Figure 7:
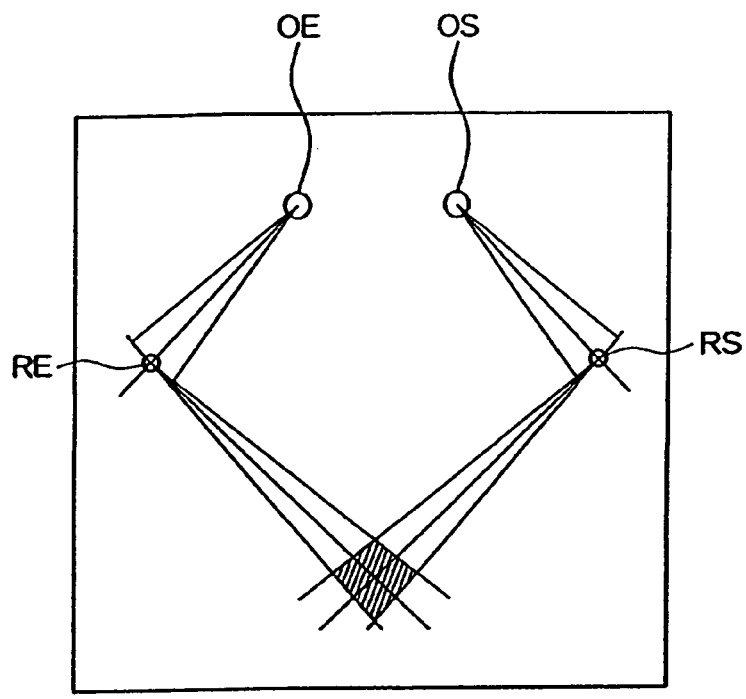
FIG. 7 is a diagram that shows the comprehensive movement trajectory of the bonding head in the embodiment of the present invention.

FIG. 7 shows the movement trajectory of the center of gravity of the bonding head caused by the first motor superimposed on the movement trajectory of the center of gravity of the bonding head caused by the second motor. The former trajectory, the movement trajectory of the center of gravity of the bonding head caused by the first motor, is a combination of a circular arc and a straight line, and it runs substantially along the central axial direction of the first movable arm from RE. The latter trajectory, the movement trajectory of the center of gravity of the bonding head caused by the second motor, is also a combination of a circular arc and a straight line, and it runs substantially along the central axial direction of the second movable arm from RS. The area where these trajectories overlap in the driving ranges of the first and second motors (the area shown by shading with diagonal lines in FIG. 7) is the area in which the movement of the center of gravity of the bonding head is controlled.

As to the trajectory of the intersection point between the direction of the thrust generated by the first motor and the direction of the thrust generated by the second motor, it is confirmed by the inventor that such a trajectory substantially coincides with the center of gravity of the bonding head. In other words, in cases where the distances to the bonding head from the rotational centers RS and RE, i.e., the lengths of the arms, are sufficiently long compared to the movement range of the bonding head as in the example shown in FIG. 7, the trajectory of the intersection point between a straight line segment that connects the rotational center RE of the first movable arm 136 and the fastening point 138 in the bonding head and a straight line segment that connects the rotational center RS of the second movable arm 146 and the shaft-supporting point 148 in the bonding head is made to coincide substantially with the position of the center of gravity of the bonding head.

As seen from the above, the trajectories of the respective points such as the center of gravity, etc. in the bonding head are expressed as combinations of straight lines and circular arcs about OE, RE, OS and RS by giving the rotational angle of the first motor about OE and the rotational angle of the second motor about OS. Accordingly, by way of installing a conversion software that converts such a combination of straight lines and circular arcs into a commonly used orthogonal coordinate system in the control section of the bonding apparatus, it is possible to use a conventional bonding head positioning control program in an orthogonal coordinate system or the like "as is".

The rotational angle of the first motor (and therefore the rotational angle of the first driving arm) and the rotational angle of the second motor (and therefore the rotational angle of the second driving arm) are detected by an appropriate angle sensor. In other word, encoders, magnetic sensors, etc. mounted on the drive shafts can be used as the angle sensor.

Figure 8:
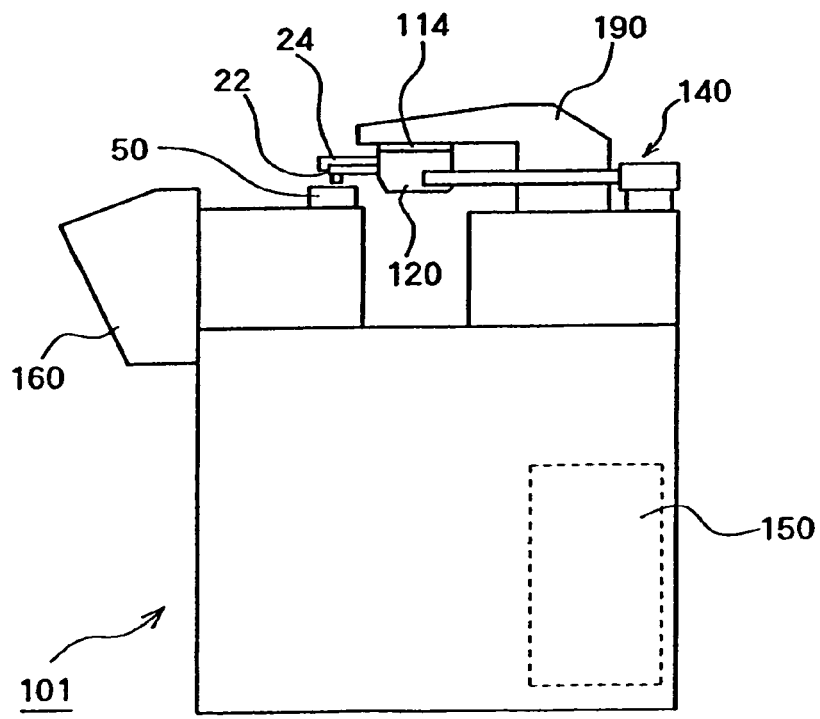
FIG. 8 is a side view of a wire bonder that uses a stand for supporting the bonding head by suspension.

FIG. 8 shows a wire bonder 101 that includes a stand 190 for suspending the bonding head 120.

A head supporting stage 114 is installed facing downward on the stand 190 so that this head supporting stage 114 faces the upper surface of the bonding head 120, and the bonding head 120 is supported by fluid pressure using the balance between the vacuum pressure of a vacuum suction port 173 and the air pressure of air blowing ports 175 installed in the bonding head 120 (as described in FIG. 3). In this structure, the bonding tool and the part that moves while being supported by the stand in the bonding head can be provided three dimensionally, thus reducing the size of the bonding head.

In the above embodiments, the first driving arm 134 is rotated about the drive shaft OE of the first motor 132 in the first link driving mechanism. In other words, the position of the drive shaft OE of the first motor and the position of the rotational center point about which the first driving arm 134 is rotated are identical. In this case, the movement of the drive shaft is amplified to the movement of the tip end of the first driving arm at the ratio of (length of first driving arm)/(radius of drive shaft). This amplification ratio can also be obtained in a structure in which the position of the drive shaft OE of the first motor and the position of the rotational center point about which the first driving arm 134 rotates are set to be different.

Such a structure can be made so that, for example, an intermediate rotating shaft is disposed perpendicular to the stand between the first motor 132 and the first movable arm 136, a pulley or the like is attached to the first motor 132 so that a new shaft-supporting point is created in this pulley, and a lever arm that connects the shaft-supporting point of the first motor 132—intermediate rotating shaft—rotational center RE on the first movable arm is provided. Then, the first motor 132 drives one end of the lever arm, and this motion is transmitted to the other end of the lever arm. The amplification ratio in this structure is determined by the splitting ratio at which the length of the lever arm is split by the intermediate rotating shaft.

Furthermore, in the present invention, using this lever arm, the first motor that drives one end of the lever arm can be a linear motor instead of a DD motor. Likewise, the above-descried structures can be applied to the second link driving mechanism 140.

As seen from the above, according to the present invention, the respective movements of the drive shafts in the first and second motors are amplified to the movements of the tip ends of the first and second driving arms. Accordingly, even if the thrust of the motors is increased, there is no hitting of the upper limit of the acceleration, and a high-speed operation can be accomplished.

More specifically, when N is assumed as an amplification ratio of the movement, then the amplification ratio N can be expressed by (length of first driving arm)/(radius of motor drive shaft) or the like. If the conversion of the inertial moment J of the movable part of the motor seen from the load side into the load side mass m is considered with the tip end of the first driving arm taken as the load side, then $J=m\times(\text{length of driving arm})^2$. Accordingly, this converted mass m is proportional to $1/N^2$. Meanwhile, the thrust F on the load side is proportional to 1/N. Accordingly, the increase in the thrust seen from the load side and the increase in the mass of the movable part are not proportional as a result of the amplification of the movement of the motor drive shafts to the movement of the tip ends of the driving arms, and there is no hitting of the upper limit of the acceleration on the load side. In other words, by using motors with higher power, it is possible to achieve a larger acceleration by means of the bonding head, and a high-speed operation can be accomplished.

According to the present invention, it is possible to reduce the eccentricity between the direction of the thrust and the center of gravity of the bonding head. Accordingly, since there is no need for an unnecessarily large increase in the rigidity of the guide mechanism in order to maintain precisions, the weight of the first and second driving arms and the weight of the first and second movable arms, etc. can be reduced, and the movement speed of the bonding head can be increased even further.

According to the present invention, the bonding head is provided on the stand by means of fluid pressure. Accordingly, the positioning precision of the bonding head improves compared to the case of frictional sliding or rolling friction, etc. It is desirable that air blowing ports and vacuum ports used for fluid pressure support be disposed on the bonding head; however, such ports can also be provided on the stand.

Furthermore, according to the present invention, the bonding head is installed by being suspended by the stand. In this structure, a three-dimensional configuration is obtained without disposing the bonding tool and the part that moves while being held by the stand in the bonding head in a planar disposition. Accordingly, the size of the bonding head can easily be reduced.

Furthermore, according to the present invention, the position of the bonding head is calculated as the position in an orthogonal coordinate system with respect to the stand based upon the rotational angle of the first motor and the rotational angle of the second motor. Accordingly, by using the converted data obtained by the calculation, the positioning control program in a conventional orthogonal coordinate system can be used "as is."

As seen from the above, the bonding apparatus of the present invention, as described above, increases the movement speed of the bonding head.

The invention claimed is:

1. A bonding apparatus comprising:
   a bonding head for performing bonding work on an object of bonding;
   a moving mechanism for moving the bonding head to arbitrary positions, said moving mechanism including:
      a first motor,
      a first driving arm being attached to a drive shaft of said first motor and being rotated in a parallel plane to a stand of the bonding apparatus,
      a first movable arm being rotatably supported at one end thereof on said first driving arm and being fastened at another end thereof to said bonding head,
      a second motor,
      a second driving arm being attached to a drive shaft of said second motor and being rotated in a parallel plane to said stand, and
      a second movable arm being rotatably supported at one end thereof on said second driving arm and being pivotally supported at another end thereof to said bonding head, and
   wherein said bonding head is supported on said stand by fluid pressure.

2. The bonding apparatus according to claim 1, wherein an intersection point between a first line segment, which connects a center of rotation of the first movable arm and a fastening point where said first movable arm is fastened to said bonding head, and a second line segment, which connects a center of rotation of said second movable arm and a point where said second movable arm is pivotally supported to said bonding head, substantially coincides with a position of a center of gravity of said bonding head.

3. The bonding apparatus according to claim 1, wherein said stand is a suspension stand in which said bonding head is suspended by said stand.

4. The bonding apparatus according to claim 1, wherein said bonding apparatus further comprises:
   a first sensor for detecting a rotational angle of said first driving arm,
   a second sensor for detecting a rotational angle of said second driving arm,
   a position calculating means for calculating a position of said banding head as a position in an orthogonal coordinate system wit respect to said stand based upon detection data of said first sensor and detection data of said second sensor, and
   a control means for performing a positional control of said bonding head based upon a calculated position in said orthogonal coordinate system.

* * * * *